United States Patent
Matsumoto et al.

(10) Patent No.: US 7,485,909 B2
(45) Date of Patent: Feb. 3, 2009

(54) SEMICONDUCTOR DEVICE AND METHOD OF MANUFACTURING THE SAME

(75) Inventors: Takanori Matsumoto, Mie (JP); Masahito Shinohe, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 29 days.

(21) Appl. No.: 11/433,465

(22) Filed: May 15, 2006

(65) Prior Publication Data

US 2006/0255390 A1 Nov. 16, 2006

(30) Foreign Application Priority Data

May 16, 2005 (JP) ............................. 2005-142243

(51) Int. Cl.
| | |
|---|---|
| H01L 31/112 | (2006.01) |
| H01L 29/12 | (2006.01) |
| H01L 27/108 | (2006.01) |
| H01L 21/338 | (2006.01) |
| H01L 21/337 | (2006.01) |
| H01L 21/8238 | (2006.01) |
| H01L 21/8249 | (2006.01) |
| H01L 21/20 | (2006.01) |

(52) U.S. Cl. .......................... 257/301; 257/68; 257/71; 257/296; 438/171; 438/190; 438/210; 438/218; 438/244; 438/381; 438/386

(58) Field of Classification Search ................. 257/301; 438/243, 386

See application file for complete search history.

(56) References Cited

U.S. PATENT DOCUMENTS

| | | | | |
|---|---|---|---|---|
| 6,008,103 | A * | 12/1999 | Hoepfner | 438/386 |
| 6,103,585 | A * | 8/2000 | Michaelis et al. | 438/386 |
| 6,190,988 | B1 * | 2/2001 | Furukawa et al. | 438/386 |
| 6,319,788 | B1 * | 11/2001 | Gruening et al. | 438/386 |
| 6,458,671 | B1 * | 10/2002 | Liu et al. | 438/391 |
| 6,600,189 | B1 * | 7/2003 | Sato et al. | 257/301 |
| 6,605,838 | B1 * | 8/2003 | Mandelman et al. | 257/305 |
| 7,087,484 | B2 * | 8/2006 | Goldbach et al. | 438/243 |

(Continued)

FOREIGN PATENT DOCUMENTS

JP 2001-144265 5/2001

(Continued)

*Primary Examiner*—Zandra V. Smith
*Assistant Examiner*—James M Mitchell
(74) *Attorney, Agent, or Firm*—Oblon, Spivak, McClelland, Maier & Neustadt, P.C.

(57) ABSTRACT

A semiconductor device includes a semiconductor substrate formed with a trench having a sidewall including a middle point. The trench includes a first part extending from a surface of the semiconductor substrate to the middle point of the trench and having a diameter that is gradually reduced as the first part extends deeper from the surface of the semiconductor substrate to the middle point of the trench. The trench includes a second part that is deeper than the middle point of the sidewall and that has a larger diameter than the middle point of the sidewall. An electrically conductive film is formed in an interior of the trench so as to be located lower than the middle point of the sidewall, the conductive film having a planarized upper surface, and a collar insulating film is formed on the conductive film and the sidewall of the trench so as to extend through the middle point of the sidewall along the sidewall.

5 Claims, 13 Drawing Sheets

U.S. PATENT DOCUMENTS

| | | | |
|---|---|---|---|
| 7,109,549 B2 * | 9/2006 | Ozawa | 257/315 |
| 2005/0118775 A1 * | 6/2005 | Goldbach et al. | 438/386 |
| 2005/0151183 A1 * | 7/2005 | Tu | 257/301 |
| 2005/0167720 A1 * | 8/2005 | Furuhata et al. | 257/301 |
| 2005/0170582 A1 * | 8/2005 | Furuhata et al. | 438/244 |

FOREIGN PATENT DOCUMENTS

| | | |
|---|---|---|
| JP | 2001-217404 | 8/2001 |
| JP | 2002-222870 | 8/2002 |

* cited by examiner

| ETCHING TIME | 10sec | 13sec | 16sec | 19sec | 22sec | 25sec | 28sec |
|---|---|---|---|---|---|---|---|
| (A) | ×/○ | ×/○ | ○/○ | ○/△ | ○/× | ○/× | ○/× |
| (B) | ×/○ | ×/○ | ○/○ | ○/○ | ○/○ | ○/○ | ○/○ |

FILM REMAINING ON SIDEWALL/REOCCURRENCE OF RECESS

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2005-142243, filed on May 16, 2005, the entire contents of which are incorporated herein by reference.

BACKGROUND OF THE INVENTION

1. Field of the Invention

The present invention relates to a semiconductor device provided with a dynamic random access memory (DRAM) cell having a trench capacitor and a method of manufacturing the same.

2. Description of the Related Art

With recent refinement of semiconductor devices, a higher and higher aspect ratio processing technique has been necessitated. Particularly in the manufacture of DRAM cells with a trench capacitor structure, the forming of a deep trench necessitates a higher aspect ratio processing technique. JP-A-2001-144265, JP-A-2001-217404 and JP-A-2002-222870 each disclose a technique for forming a deep trench into a bottle shape. An inside area of the trench can be increased when a deep trench is formed into a bottle shape. A capacity of the trench capacitor can be increased when a capacitor is then formed on an inner surface of the bottle-shaped trench.

Thus, since the trench is formed into the bottle shape, an upper part of the trench has a tapered section, that is, the upper part of the trench has a larger diameter than a lower part of the trench. However, an aspect ratio of the trench is increased with reductions in design rules and refinement of elements. As a result, it is difficult to control a taper angle of the upper part section of the trench. Accordingly, the taper angle is increased nearly to a vertical angle. For example, the taper angle sometimes exceeds 89° or 90°. When the taper angle exceeds 90°, the upper part section of the trench has the shape of an inverted taper or an overhung shape. The taper angle thus increased nearly to 90° results in a void formed in a conductive film buried deep in the trench and/or a seam formed in an upper part of the conductive film.

A collar insulating film needs to be formed on the conductive film and sidewall faces of the trench after the aforementioned trench forming step. The collar insulating film has a large thickness in order that electric charge may be prevented from being discharged from the conductive film. The collar insulating film is generally formed in the following manner. The conductive film is formed deep in the trench and thereafter, the collar insulating film is isotropically formed on the sidewalls of the trench and on the conductive film. The collar insulating film formed on the conductive film is then removed by an anisotropic etching process while the collar insulating film remains on the sidewalls of the trench. Thus, the collar insulating film is formed on the sidewalls of the trench.

As the taper angle of the trench upper section is increased nearly to a vertical angle, a void occurs in the conductive film and/or a seam is produced in the upper part of the conductive film. As a result, the collar insulating film remains on the conductive film even if the anisotropic etching is carried out to remove the collar insulating film isotropically formed on the conductive film. Subsequent to the anisotropic etching process, another conductive film needs to be further deposited on the conductive film in the trench so that the conductive film is electrically conductive to a transistor. However, when the collar insulating film remains on the conductive film formed deep in the trench, for example, the electric contact becomes insufficient even if the another conductive film is formed on the conductive film. This results in an increase in the resistance of an electrode or an electrically insulated state, whereupon a malfunction tends to occur in the semiconductor device.

BRIEF SUMMARY OF THE INVENTION

Therefore, an object of the present invention is to provide a semiconductor device in which the resistance of the conductive film formed deep in the trench can be reduced and a method of manufacturing the same.

In one aspect, the present invention provides a semiconductor device a semiconductor device comprising a semiconductor substrate formed with a trench having sidewall including a middle point, the trench including a first part extending from a surface of the semiconductor substrate to the middle point of the trench and having a diameter that is gradually reduced as the first part extends deeper from the surface of the semiconductor substrate to the middle point of the trench, the trench including a second part that is deeper than the middle point of the sidewall and that has a larger diameter than the middle point of the sidewall, an electrically conductive film formed in an interior of the trench so as to be located lower than the middle point of the sidewall, the conductive film having a planarized upper surface, and a collar insulating film formed on the conductive film and the sidewall of the trench so as to extend through the middle point of the sidewall along the sidewall.

In another aspect, the invention provides a method of manufacturing a semiconductor device, comprising etching a semiconductor substrate so that a trench is formed so as to have a bottle shape with a bottleneck, burying a first electrically conductive film in the trench so that a recess is formed in the first conductive film so as to be located below the bottleneck, forming a second electrically conductive film in the recess of the first conductive film, etching the second conductive film down below the bottleneck and planarizing an upper surface of the second conductive film, and forming an insulating film over the second conductive film in the trench.

BRIEF DESCRIPTION OF THE DRAWINGS

Other objects, features and advantages of the present invention will become clear upon reviewing the following description of the embodiment with reference to the accompanying drawings, in which.

DETAILED DESCRIPTION OF THE INVENTION

Figure 1:
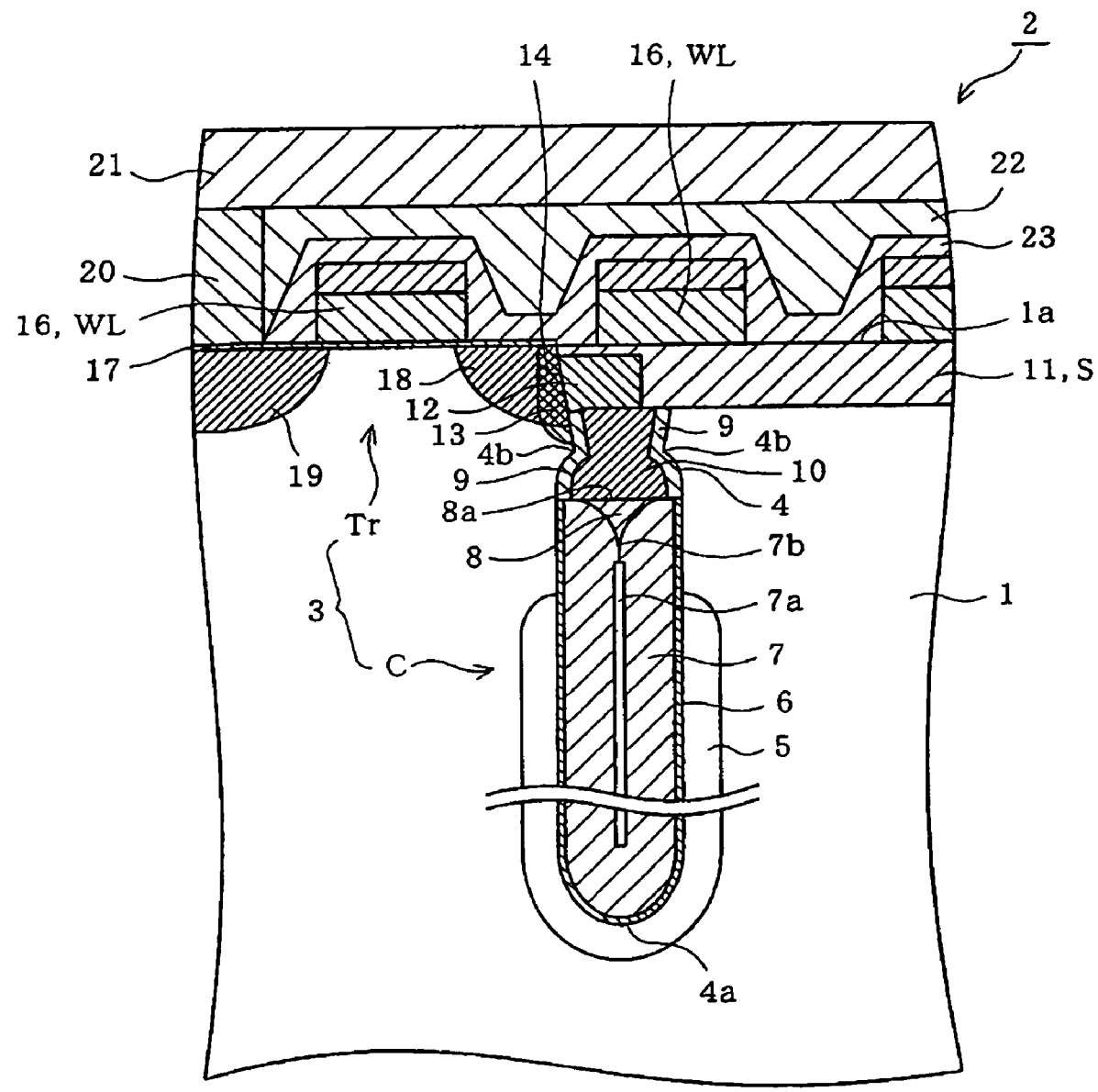
FIG. 1 is a longitudinal side section of a memory cell representing a first embodiment of the present invention, the view being taken along line 1-1 in FIG. 2.
Figure 2:
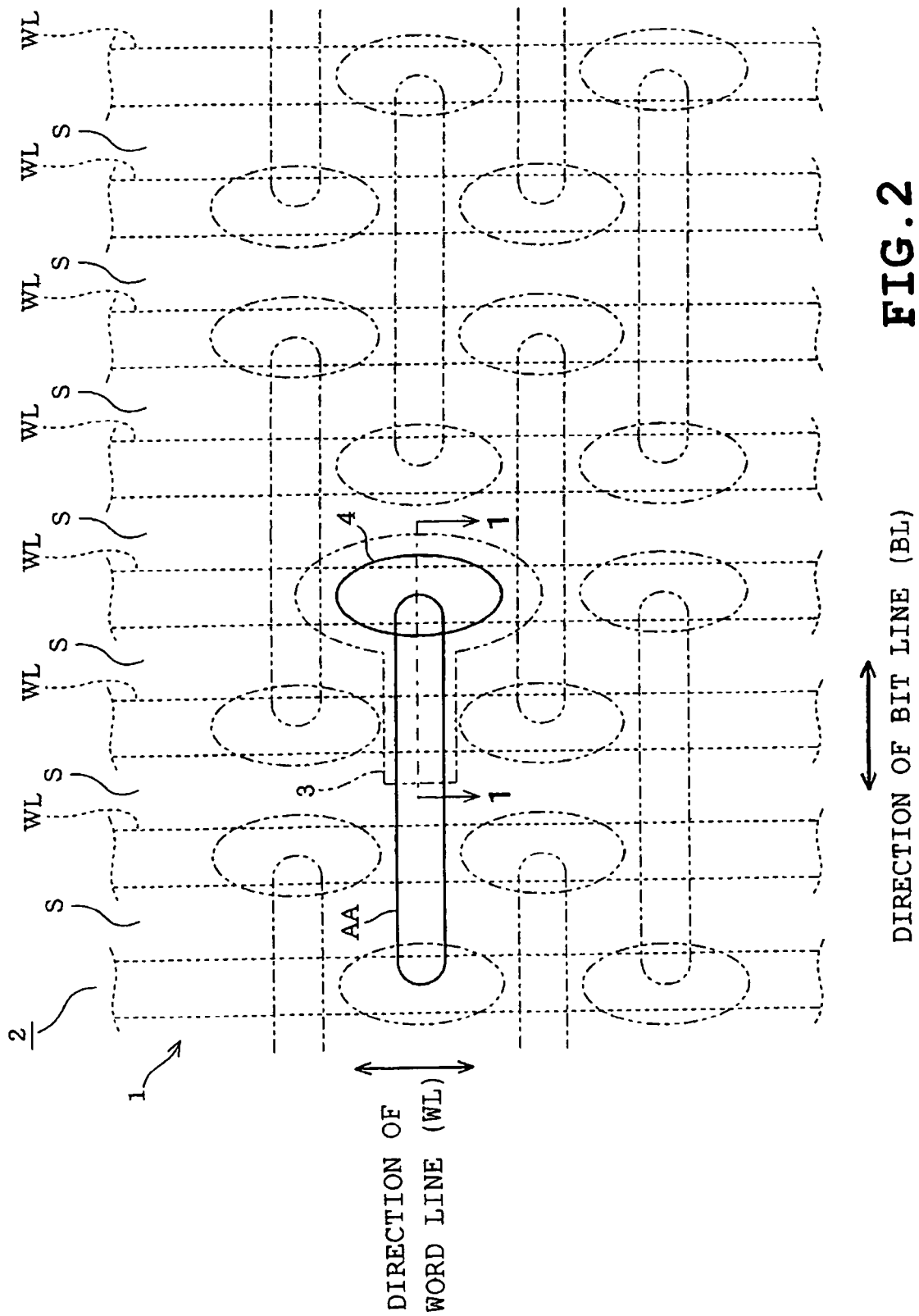
FIG. 2 is a schematic plan view of the memory cell, showing a typical arrangement thereof.

One embodiment of the invention will be described with reference to FIGS. 1 to 19. FIG. 1 is a longitudinal side section of a trench capacitor DRAM cell of the embodiment serving as a semiconductor device. FIG. 2 is a schematic plan view of the DRAM cell.

Structure

Referring to FIG. 2, DRAM 2 provided with the trench capacitor DRAM cell in accordance with the invention comprises a p-type silicon substrate 1 having a memory cell region in which a number of memory cells 3 are arranged. Reference symbol AA in FIG. 2 designates an active area of each memory cell 3. Reference symbol WL designates a word line. Reference symbol S designates an element isolation region. The active area AA involves a source/drain region 18 and a channel region of a cell transistor Tr which will be described later.

The silicon substrate 1 includes an element isolation region S of a shallow trench isolation (STI) structure. The element isolation region S is formed in a surface layer of the silicon substrate 1. The element isolation region S defines the active area AA formed in the surface layer of the silicon substrate 1 and serves to render a section between a trench capacitor C and the word line WL high resistive.

FIG. 1 is a schematic longitudinal side section of the memory cell taken along line 1-1 in FIG. 2. Each memory cell 3 comprises one trench capacitor C and one cell transistor Tr as shown in FIG. 1. The configuration of the memory cell 3 will now be described. The silicon substrate 1 is formed with a deep trench 4. The trench capacitor C is formed on the bottom 4a side in the trench 4. The trench 4 has an elliptic shape on a plane. The trench 4 has a generally bottle-like shape. The shape of the trench 4 will now be described. The trench 4 includes a part formed into the shape of a tapered hole. This part extends downward from a surface 1a of the silicon substrate 1 to a middle 4b. Since this part is tapered, the diameter thereof is gradually reduced as this part become deeper. A sidewall or inner surface of the trench 4 is bent at the middle 4b, whereupon the middle 4b serves as a bent part. The trench 4 has another part formed into a taper shape or gradually spread as this part becomes deeper. Thus, the trench 4 is formed so as to be convex upward beneath the middle 4b. The middle 4b is formed into a bottleneck or constriction. The diameter of the trench 4 is once increased downward from the middle 4b toward the bottom 4a side but reduced at the bottom 4a side. Accordingly, trench 4 is formed so as to be tapered toward the end at the bottom 4a side.

A plate diffusion layer 5 is formed on the outer periphery of the trench 4 so as to extend upward from the bottom 4a side to a predetermined level (or more specifically, a predetermined location below the middle 4b). The plate diffusion layer 5 serves as a plate electrode of the trench capacitor constituting the memory cell 3. A capacitor insulating film 6 is formed on a part of the sidewall of the trench 4 at the bottom 4a side so as to be in contact with the plate diffusion layer 5. The capacitor insulating film 6 may be a SiN—SiO$_2$ film, Al$_2$O$_3$—SiO$_2$ film or HfO$_2$—SiO$_2$ film, for example and is isotropically formed on the inner surface of the trench 4 at the bottom 4a side. The capacitor insulating film 6 serves to isolate both plate electrodes of the trench capacitor C from each other.

A first electrically conductive film 7 is formed inside the capacitor insulating film 6 in the interior of the trench 4. The first conductive film 7 serves as a plate electrode of the trench capacitor C and is made from polycrystalline silicon, amorphous silicon or polycide (metal silicide) each doped with a donor impurity such as arsenic or phosphor. The first conductive film 7 has a centrally formed void (seam) 7a and an upper depression (concavity) 7b. The depression 7b is formed so as to be depressed in an upper part of the first conductive film 7 into a Y-shape. The depression 7b has an upper surface located below the middle 4b.

The trench 4 has a sidewall insulating film 9 formed on the inner peripheral surface of the sidewall so as to be located over the first conductive film 7 and the capacitor insulating film 6 and so as to straggle the middle 4b of the trench 4. The sidewall insulating film 9 has a larger film thickness than the capacitor insulating film 6 for the purpose of suppressing leak current with occurrence of a vertical parasitic transistor and serves as a collar insulating film.

A second electrically conductive film 8 is formed in the depression 7b of the first conductive film 7. The second conductive film 8 also serves as a plate electrode of the trench capacitor C as the first conductive film 7 and is made from polycrystalline silicon, amorphous silicon or polycide (metal silicide) each doped with an impurity. The second conductive film 8 has an upper surface 8a which is substantially planarized and located lower than the middle 4b of the trench 4.

A third electrically conductive film 10 is formed on the second conductive film 8 inside the sidewall insulating film 9. The third conductive film 10 is made from polycrystalline silicon, amorphous silicon or polycide (metal silicide) each doped with a donor impurity such as arsenic or phosphor. The third conductive film 10 has a larger film thickness than the second conductive film 8. The second conductive film 8 buried in the depression 7b provides good connection between the first and third conductive films 7 and 10.

An element isolating insulating film 11 such as a silicon oxide film is formed on a part of the upper surface of the third conductive film 10. A fourth electrically conductive film 12 is formed on a part of the upper surface of the third conductive film 10 and a part of the side of the element isolating insulating film 11. The fourth conductive film 12 is also made from polycrystalline silicon, amorphous silicon or polycide (metal silicide) each doped with a donor impurity such as arsenic or phosphor and functions as a burying strap. The element isolating insulating film 11 serves to maintain each of the first to fourth conductive films 7, 8, 10 and 11, other memory cells and the word line WL in an electrically high resistive state.

The cell transistor Tr is formed at a predetermined side on a horizontal plane of the trench 4. A strap 13 is formed on a part of outer periphery of the trench 4 or an interface between the fourth conductive film 12 buried in the trench 4 and the cell transistor C as shown in FIG. 1. The strap 13 is formed by diffusing the donor impurity outward from the conductive film 12 through an interface 14 located in an upper part of the trench 4. The cell transistor Tr is provided with gate electrodes 16, a gate insulating film 17 and source/drain regions 18 and 19 serving as n-type diffusion layers. Each gate electrode 16 also serves as the word line WL. The region 18 (a source region in the embodiment) is formed so as to be electrically connected to the fourth conductive film 12. A bit line 21 is conductively connected via a contact plug 20 to the region 19 (a drain region in the embodiment).

A gate sidewall insulating film 23 is formed so as to cover the gate electrodes 16. An interlayer insulating film 22 is provided for maintaining the bit line 21, transistor Tr and trench capacitor C in the high resistive state. Thus, the trench capacitor C comprises the first to fourth conductive films 7, 8, 10 and 12, the plate diffusion layer 5 and the capacitor insulating film 6 formed between the first conductive film 7 and the plate diffusion layer 5.

In the foregoing embodiment, the trench 4 is formed into the shape of the bottle with the bottleneck formed in the middle 4b. The first conductive film 7 is buried in the trench 4 so as to be located lower than the middle 4b. As a result of such formation, the first conductive film 7 has the large depression (concavity) 7b in the upper part thereof. The second conductive film 8 is buried in the depression 7b. Consequently, the upper surface 8a of the second conductive film 8 can reliably be planarized. The third conductive film 9 is buried in the trench 4 so as to be located over the second conductive film 8. Consequently, the conductivity of each of the first to third conductive films 7 to 9 can be improved, and the resistance value of the interface resistance can be suppressed, whereupon sufficient electrical connection can be ensured.

Manufacturing Method

A method of manufacturing the foregoing semiconductor storage device with the trench capacitor DRAM cell will now be described with reference to FIGS. 3 to 18. Characteristic steps of the manufacturing method in the embodiment will be described in the following. On condition that the manufacturing method in accordance with the invention can be realized, one or more of the steps may be eliminated and/or one or more ordinary steps may be added.

Figure 3:
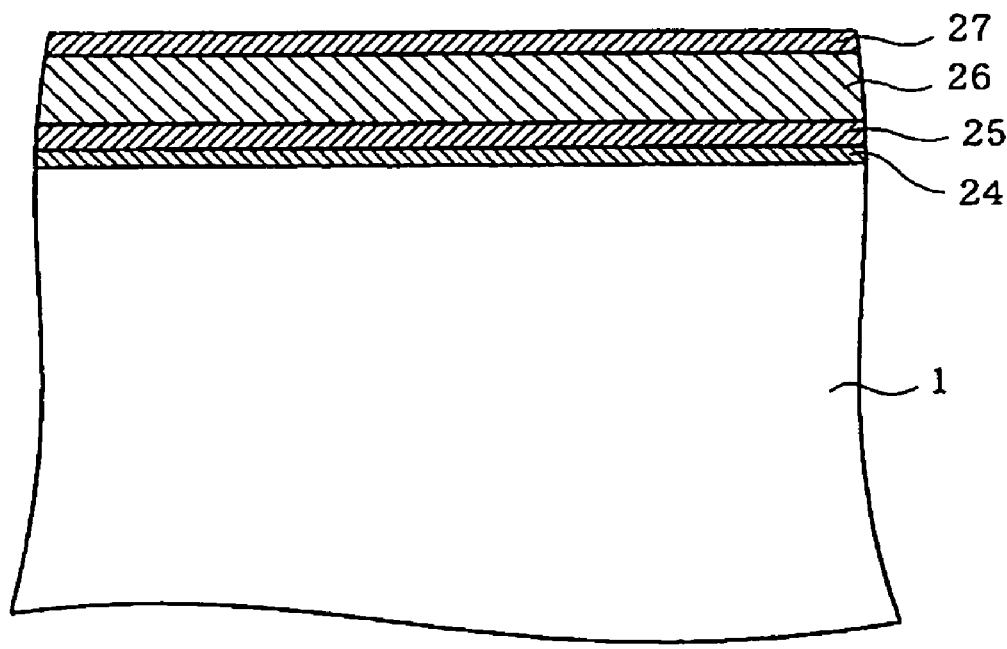
FIGS. 3 through 17 are longitudinal side sections of the memory cell in sequential steps of the manufacturing process.

FIGS. 3 through 17 are longitudinal side sections of the memory cell in sequential steps of the manufacturing process. Firstly, as shown in FIG. 3, a silicon oxide film 24 is deposited on the silicon substrate 1. A silicon nitride film 25 is then deposited on the silicon oxide film 24. A boron silicate glass (BSG) film 26 is deposited on the silicon nitride film 25. A tetraethyle orthosilicate (TEOS) film 27 is deposited on the BSG film 26.

Figure 4:
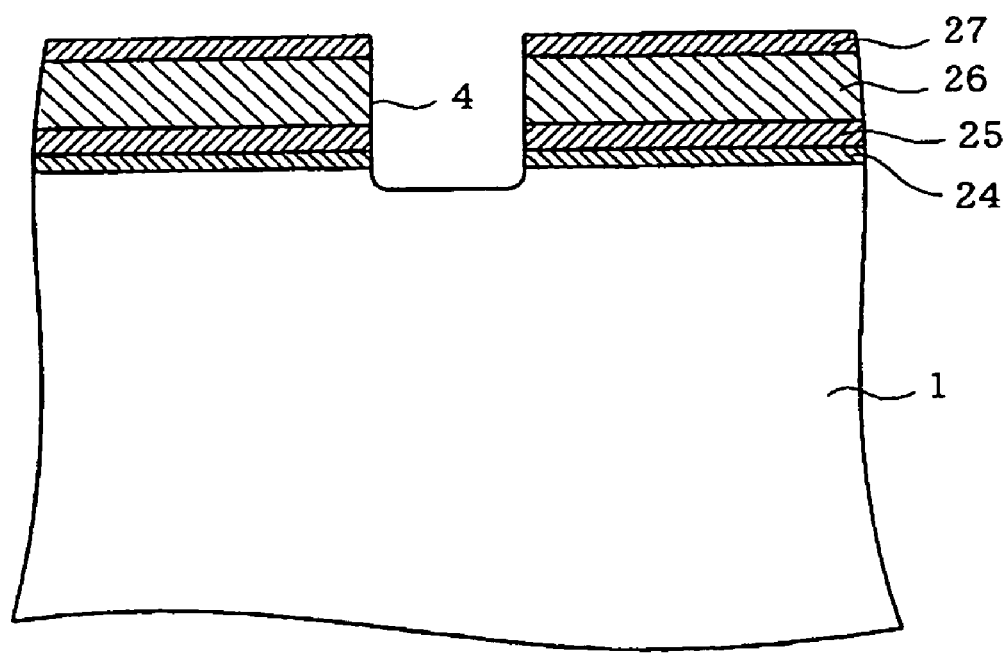

Subsequently, as shown in FIG. 4, resist (not shown) is applied onto the TEOS film 27 to be formed into a resist pattern. An anisotropic etching process is carried out so that the TEOS film 27, BSG film 26, silicon nitride film 25 and the silicon oxide film 24 are etched. As a result, the trench 4 is formed and thereafter, the resist pattern is removed.

Figure 5:
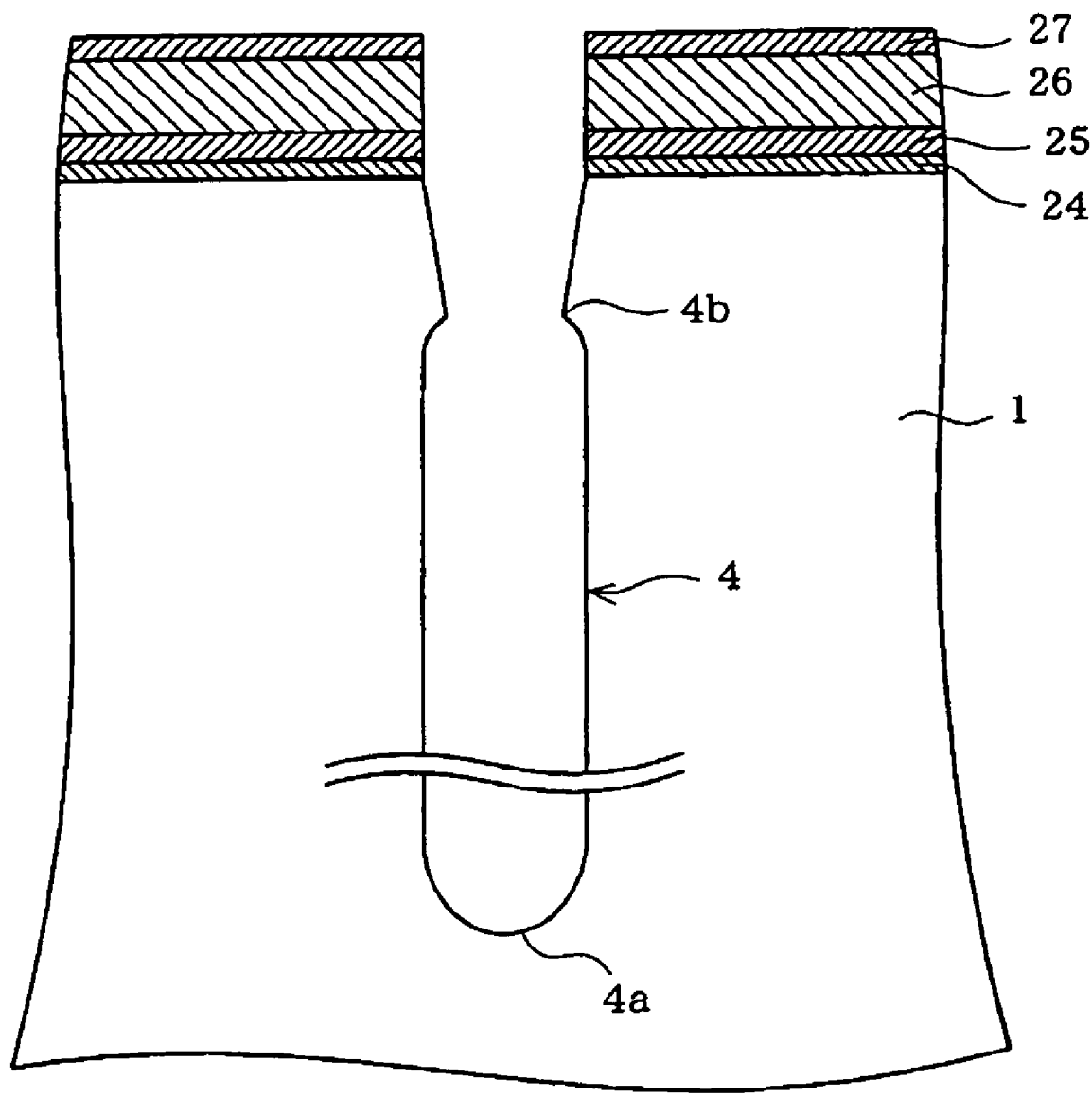

Subsequently, as shown in FIG. 5, an anisotropic etching process is carried out with the BSG and TEOS films 26 and 27 serving as a mask so that a predetermined depth is reached in the silicon substrate 1. In this case, the middle 4b serving as the bottleneck is formed at a preselected depth. In the step of forming the trench 4 with the middle 4b, a halogen gas and a fluorocarbon gas are used for the etching. Consequently, the bottleneck can easily be formed.

Figure 6:
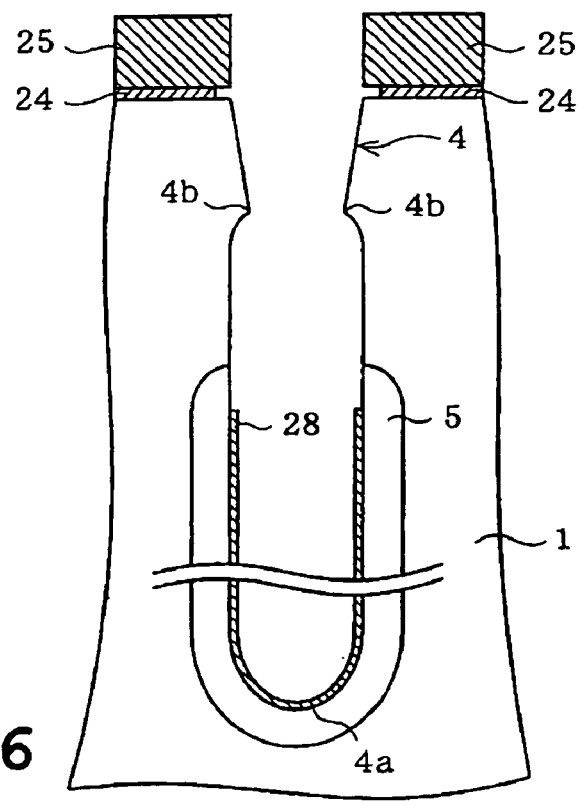

Subsequently, the TEOS film 27 and the BSG film 26 are removed. Thereafter, as shown in FIG. 6, the silica glass 28 doped with the impurity is deposited so that a predetermined depth starting from the bottom 4a of the trench 4 is reached. The silica glass 28 is covered with a TEOS film (not shown). A thermal treatment is carried out at a high temperature so that a plate diffusion layer 5 of the trench capacitor C is formed outside the trench 4. The TEOS film and the silica glass 28 in the trench 4 are then removed and the cleaning is carried out.

Figure 7:
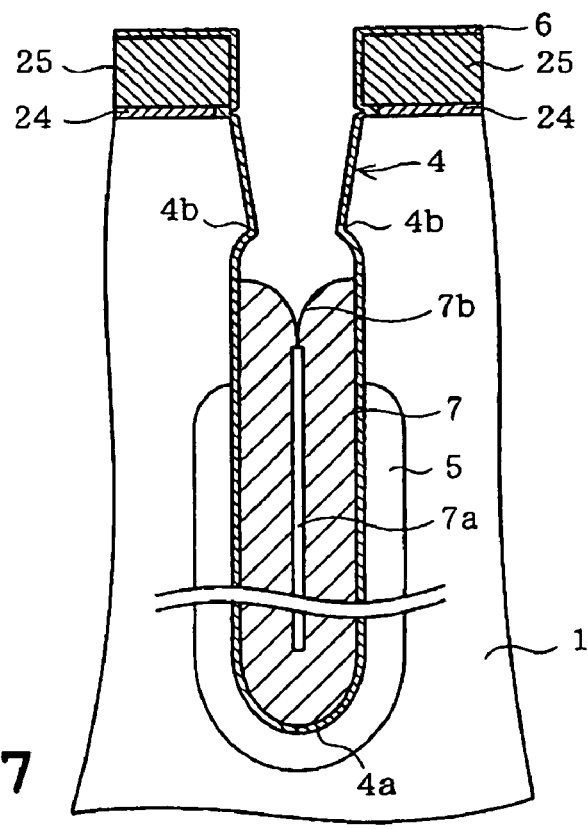

Subsequently, as shown in FIG. 7, the capacitor insulating film 6 is formed on the inner surface of the trench 4 (the sidewall) so as to straggle the middle 4b. The capacitor insulating film 6 may be an SiN—$SiO_2$ film, $Al_2O_3$—$SiO_2$ film or $HfO_2$—$SiO_2$ film.

Next, the conductive film made from polycrystalline silicon, amorphous silicon, metal silicide or metal layer each doped with a donor impurity such as arsenic or phosphor. An upper part of the conductive film is etched so that the first conductive film 7 is formed at the bottom 4a side in the trench 4. In this case, the seam 7a is formed substantially in the central part of the first conductive film 7 and the depression 7b is formed in the upper part of the first conductive film 7. Since etchback reaches a part of the conductive film 7 below the middle 4b, the depression 7b tends to become large.

Figure 8:
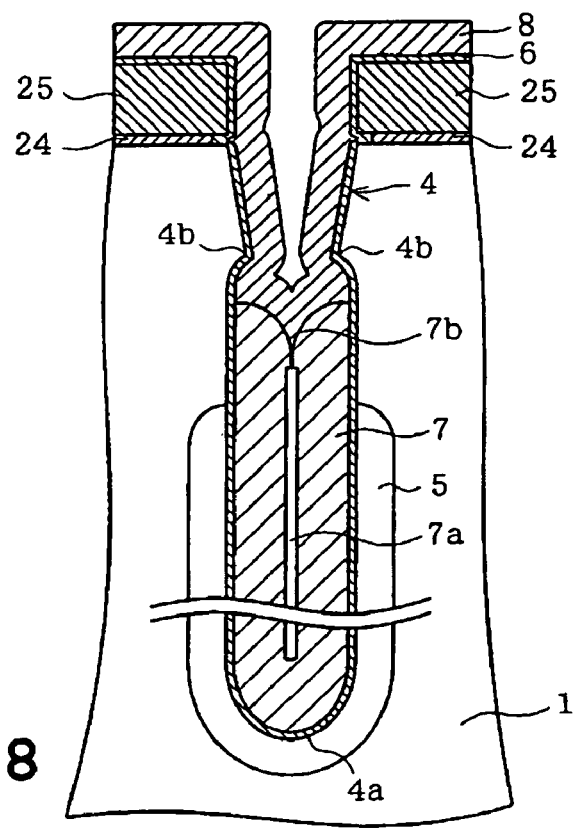

Next, as shown in FIG. 8, the second conductive film 8 is isotropically formed in the trench 4. The second conductive film 8 is made from the polycrystalline silicon, amorphous silicon or metal silicide each doped with impurity. The second conductive film 8 is buried in the depression 7b. In this case, when amorphous silicon is employed, it is desirable to form the second conductive film 8 under the condition of a low temperature in order that the coverage characteristic may be improved.

Figure 9:
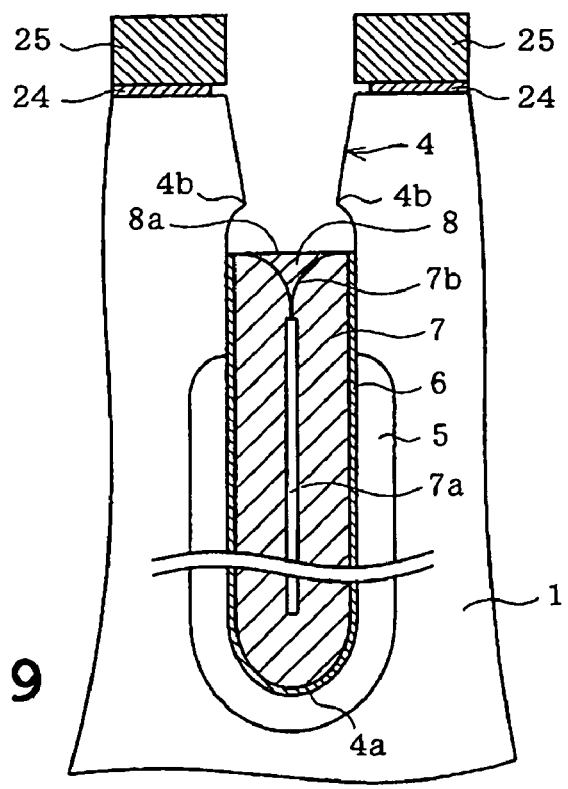

Subsequently, as shown in FIG. 9, the second conductive film 8 is etched back by a dry etching process such as a chemical dry etching (CDE) process or an isotropic etching process such as a wet etching process using KOH, whereby the upper surface 8a of the second conductive film 8 is planarized. In etching back the film 8, an etching time is adjusted so that an amount of etching becomes equal to an addition of an amount of the second conductive film 8 formed on an inner face of the capacitor insulating film 6 and overetching by 50% or more preferably by 20%. As a result, desired planarity can be ensured with respect to the first conductive film 7 and the upper surface of the second conductive film 8. Subsequently, the capacitor insulating film 6 exposed on the inner surface of the trench 4 is removed by a wet etching process.

Figure 10:
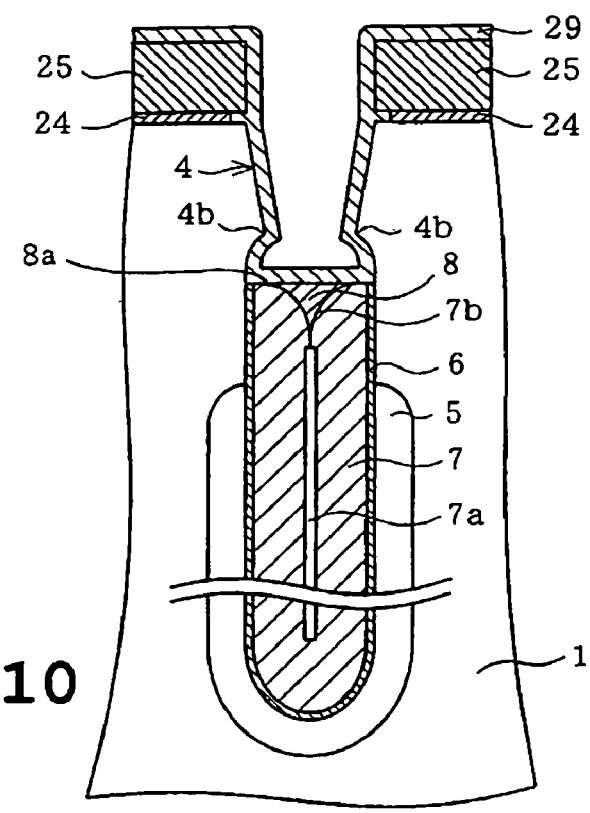
Figure 11:
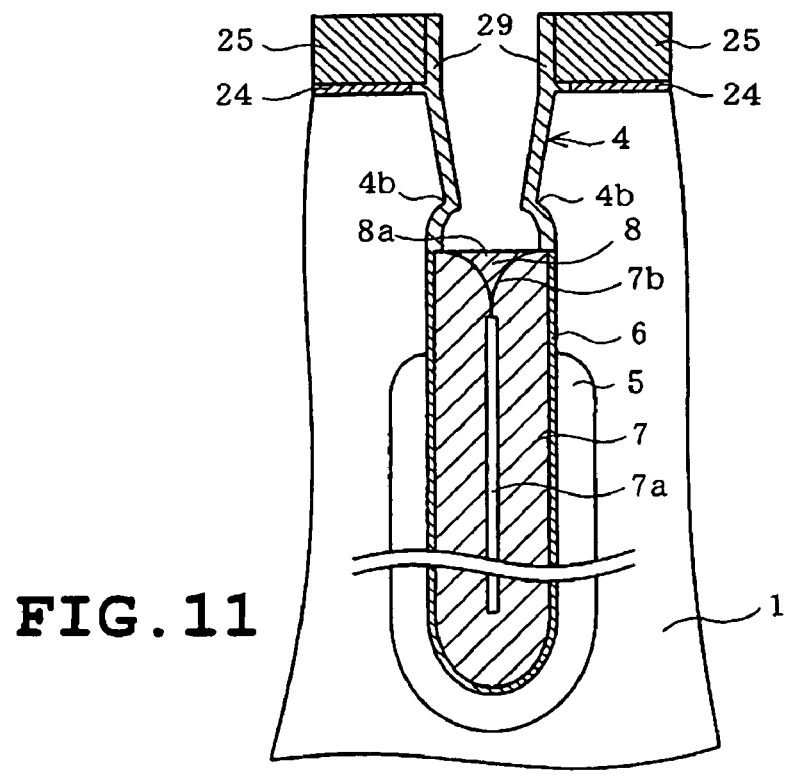

Subsequently, as shown in FIG. 10, an insulating film 29 is isotropically formed on the inner surface of the trench 4 and the upper surface 8a of the second conductive film 8. The insulating film 29 is preferably an oxide film or oxynitride film. Next, as shown in FIG. 11, the insulating film 29 formed on the first conductive film 7 and the upper surface 8a of the second conductive film 8 is removed by an anisotropic etching process so that part of the insulating film 29 on the inner surface of the sidewall of the trench 4 remains unremoved. Thus, the insulating film 29 formed on the upper surface 8a of the second conductive film 8 is removed such that the upper surface 8a is exposed. Since the second conductive film 8 has substantially a plane surface 8a, the insulating film 29 formed on the upper surface 8a can reliably be removed.

Figure 12:
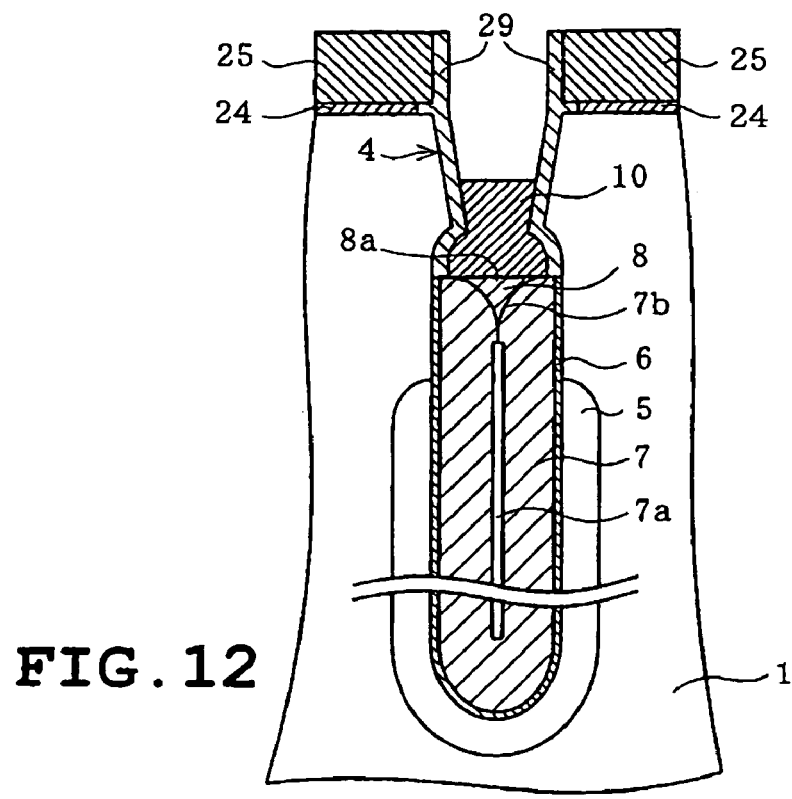

Subsequently, as shown in FIG. 12, the third conductive film 10 is formed on the second conductive film 8 in the trench 4, and an etchback process is carried out so that a predetermined depth from the upper surface 1a of the silicon substrate 1 is reached. In this case, since the upper surface 8a of the second conductive film 8 is planarized as mentioned above, reliable electrical connection can be achieved between the first and second conductive films 7 and 8, and the third conductive film 10. This results in a reduction in an interface resistance between the first and second conductive films 7 and 8 and an interface between the second and third conductive films 8 and 10, and variations in the interface resistance values can be suppressed.

Figure 13:
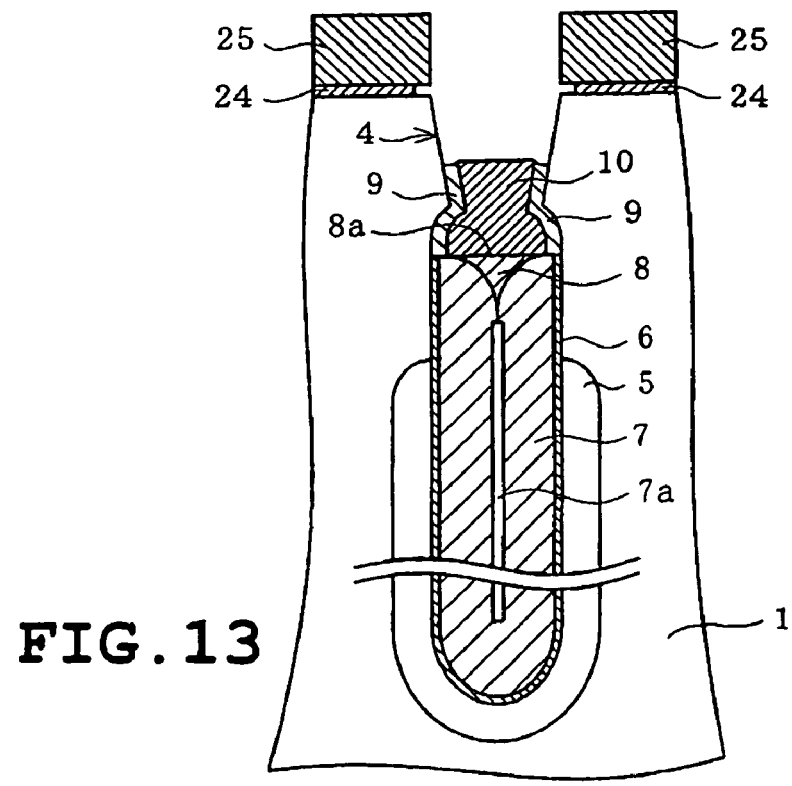

Subsequently, as shown in FIG. 13, the insulating film 29 formed on the inner surface of the sidewall of the trench 4 is removed until an upper surface of the third conductive film 10 is reached. This results in formation of the sidewall insulating film 9 which is a part of the film 10 remaining between an outer surface of the film 10 and the inner surface of the trench 4. The sidewall insulating film 9 is formed so as to extend through the middle 4b along the inner surface of the trench 4.

Figure 14:
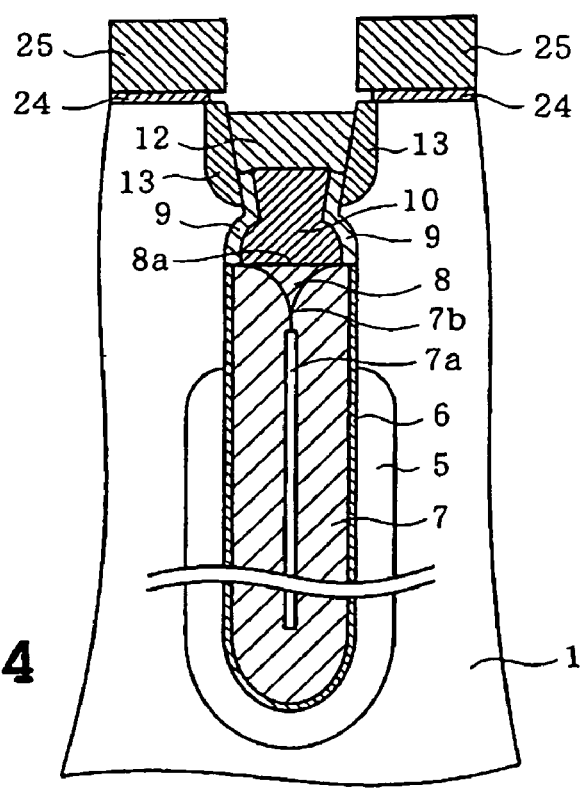

Subsequently, as shown in FIG. 14, a fourth conductive film 12 is formed on the sidewall insulating film 9 and the third conductive film 10. An etchback process is carried out to a location slightly lower than the upper surface of the silicon substrate 1, so that the fourth conductive film 12 is formed so as to be in contact with the silicon substrate 1. Furthermore, a thermal treatment is carried out so that a donor type impurity is diffused from the fourth conductive film 12 to a part of the silicon substrate 1 around the upper part of the trench 4, whereby the strap 13 is formed. The strap 13 is provided for suppressing electrical resistance between the source region 18 of the cell transistor Tr and the trench capacitor C.

Figure 15:
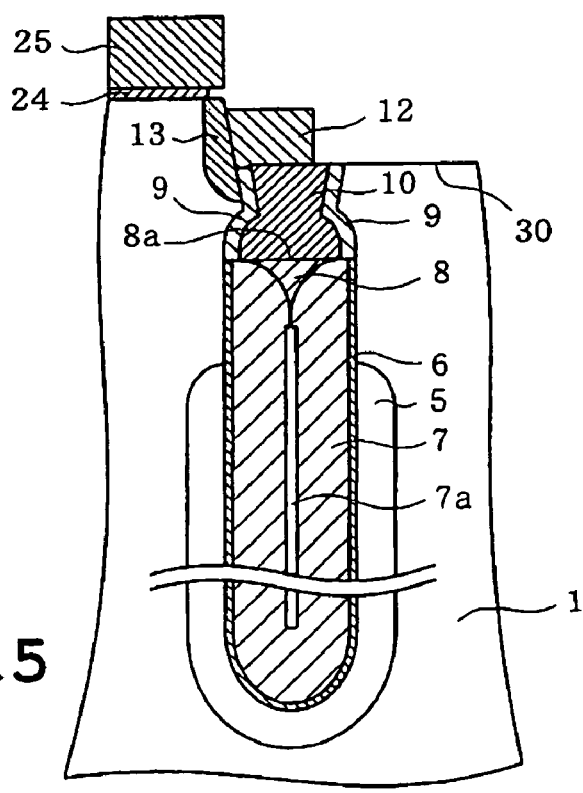
Figure 16:
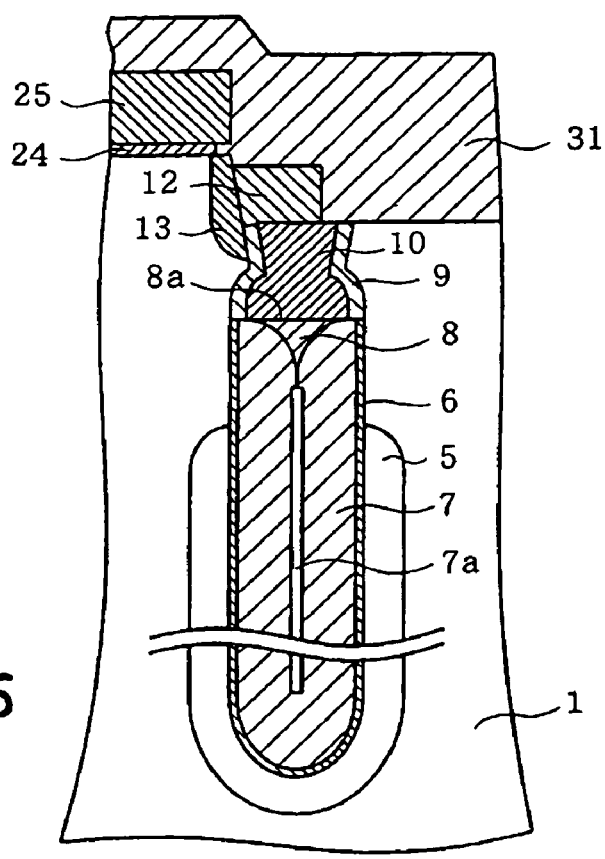
Figure 17:
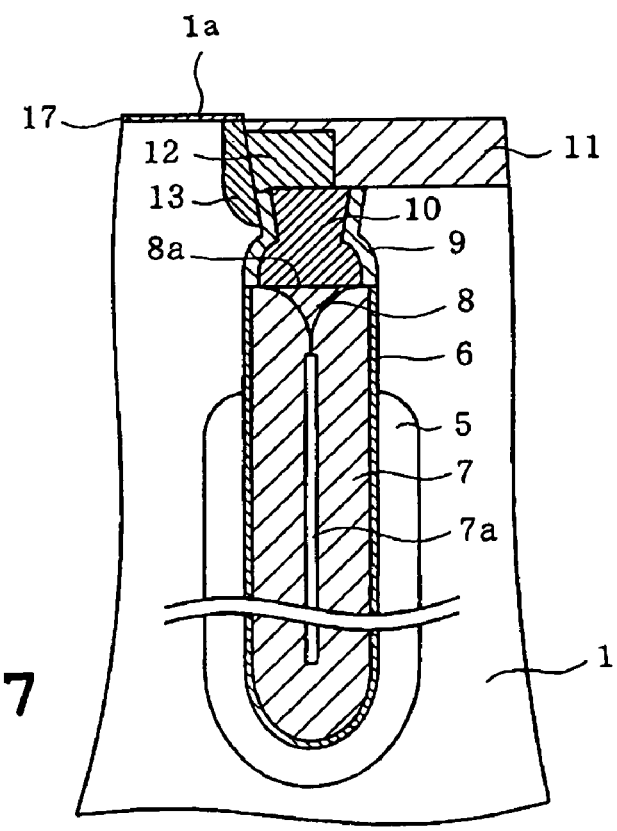

Subsequently, as shown in FIG. 15, a trench 30 for an element isolation region is formed on the side of the trench 4. Thereafter, as shown in FIG. 16, a silicon oxide film 31 is formed in the trench 30. The silicon oxide film 31 is then removed so that an upper surface thereof is located near the upper surface 1a of the silicon substrate 1, whereby the element isolation insulating film 11 is formed. Furthermore, the silicon oxide film 24 and the silicon nitride film 25 are also removed, as shown in FIG. 17. A gate oxide film 17 is formed on the upper surface 1a of the silicon substrate 1.

Subsequently, as shown in FIG. 1, the gate electrodes 16, source/drain regions 18 and 19, gate sidewall insulating film 23 are formed. Furthermore, the interlayer insulating film 22, contact plug 20 and bit line 21 are formed. Subsequent steps have no relation to the features of the embodiment and accordingly, description of the steps will be eliminated. The memory cell 3 provided with the cell transistor Tr and the trench capacitor C is manufactured through the above-described steps.

Evaluation

The inventors evaluated the DRAM 2 with special attention to the depth of the middle 4b of the trench 4. <Second conductive film 8 remaining on inner wall of capacitor insulating film 6 and second conductive film buried in depression 7b>

In the step as shown in FIG. 8, deficiency would result from the second conductive film 8 remaining on a location where the sidewall insulating film 9 is to be formed (the inner surface of the capacitor insulating film 6 formed on the upper inner wall of the trench 4) when the second conductive film 8 is etched back thereby to be removed. More specifically, the second conductive film 8 is etched back and thereafter, a wet etching process is carried out for the purpose of eliminating the capacitor insulating film 6 on such a condition that a higher selectivity is given to the film 8. In this case, when the second conductive film 8 remains on the inner surface of the capacitor insulating film 6 immediately before the wet etching process, the capacitor insulating film 6 is hard to remove.

Figures 18A, 18B:
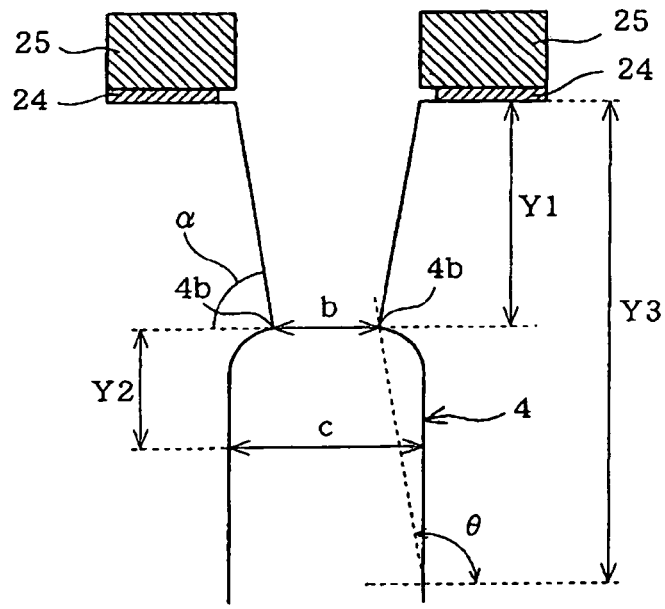
FIG. 18A illustrates dimensions of a trench.
FIG. 18B shows results of an experiment.

In view of the above problem, the second conductive film 8 needs to be removed in the step as shown in FIG. 8 so that the second conductive film 8 is prevented from remaining on the inner surface of the capacitor insulating film 6. However, when an etching process is carried out to remove the second conductive film 8 formed on the inner surface of the capacitor insulating film 6, there is a possibility that the second conductive film 8 formed in the depression 7b formed in the upper part of the first conductive film 7 as well as the second conductive film 8 formed on the inner surface of the capacitor insulating film 6. If the second conductive film 8 formed in the depression 7b is removed, the depression 7b would be reproduced. Accordingly, appropriate etching conditions need to be set. The inventors then conducted an experiment with various etching conditions being set. FIGS. 18A and 18B show the results of the experiment. The inventors compared two types of trenches having the middles 4b located deep and shallowly respectively. Condition (A) in FIG. 18B represents the case where the middle 4b is located deep and Condition (B) in FIG. 18B represents the case where the middle 4b is located shallowly and corresponds to the trench 4 in the embodiment.

FIG. 18B shows the experimental results obtained by observing whether the second conductive film 8 remained on the inner surface of the capacitor insulating film 6 and whether the depression 7b was reproduced. In this case, the second conductive film 8 was formed on the first conductive film 7 in the trench 4 as shown in FIG. 8. The second conductive film 8 was etched back such that the upper surface 8a was planarized.

In condition (B) in FIG. 18B, a taper angle $\alpha$ (see FIG. 18A) was set at 89.5° and depth Y1 from the upper surface of the substrate 1 to the middle 4b was set at 0.5 µm. Depth Y3 from the upper surface of the substrate 1 to the upper surface 8a of the second conductive film 8 was set at 1.1 µm. On the other hand, condition (A) in FIG. 18B relates to a conventional trench structure. In condition (A), depth Y1 was set to be larger than depth Y1 in condition (B). In particular, depth Y1 in condition (A) was set to be larger than depth of the upper surface 8a of the second conductive film 8.

More specifically, the first and second conductive films 7 and 8 were formed so as to be located more shallowly than depth Y1 in condition (A). When an etching time was set so as to be shorter than a predetermined time (16 sec, for example), the second conductive film 8 was apt to remain on the inner wall of the capacitor insulating film 6 although the depression 7b was hard to reproduce, as shown in FIG. 18B. On the contrary, when an etching time was set so as to be longer than the predetermined time, the depression 7b was apt to be reproduced although the second conductive film 8 was less likely to remain on the inner wall of the capacitor insulating film 6. Accordingly, an etching time needs to be fine controlled in an etching process when depth Y1 is relatively large and the second conductive film 8 is formed up to a location more shallowly than the middle 4b. In this case, a process margin is narrow and a yield tends to be reduced.

On the other hand, the second conductive film 8 can be formed so that the upper surface 8a thereof is located deeper than the middle 4b in the case of condition (B) since depth Y1 of the middle 4b is relatively smaller. In this case, when an etching time is set so as to be shorter than the predetermined time (16 sec, for example), the depression 7b is also hard to reproduce although the second conductive film 8 is apt to remain on the inner wall of the capacitor insulating film 6, as in condition (A). However, even when an etching time is set so as to be longer than the predetermined time, it is confirmed that the depression 7b is hard to reproduce while no second conductive film 8 remains on the inner wall of the capacitor insulating film 6.

In the condition (B), when an etching process is carried out for a longer period of time as compared with the condition (A), an appropriate result can be achieved from the etching process. Consequently, the process margin and the yield can be improved.

Evaluation of Number of Defects

Figure 19A:
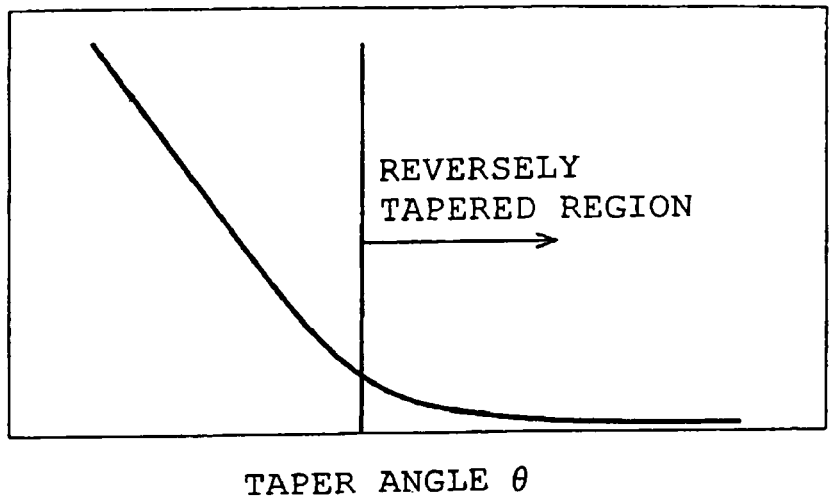
FIG. 19A is a graph showing the relationship between a taper angle and the number of defects.
Figure 19B:
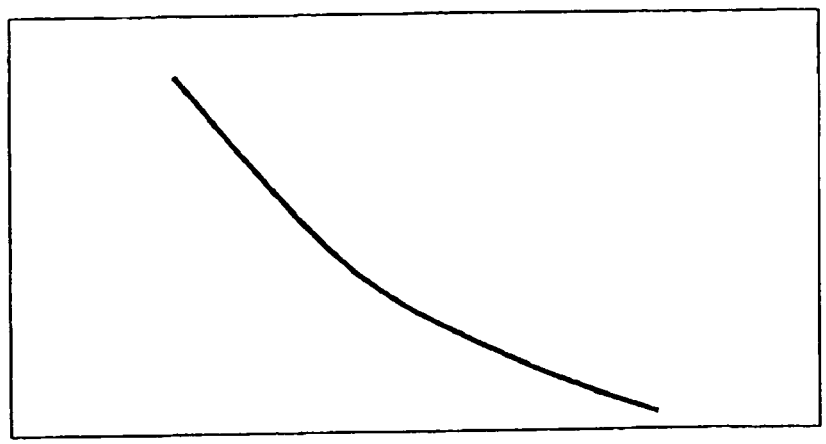
FIG. 19B is a graph showing the relationship between trench diameter difference and the number of defects.

The inventors changed depth Y1 of the middle 4b to evaluate the dependency of the number of defects upon a burying characteristic of the second conductive film 8. FIGS. 19A and 19B show the results of the evaluation. FIG. 19A shows the relationship between a taper angle $\theta$ (see FIG. 18A) and the number of defects at a location of depth Y3 lower than the middle 4b. FIG. 19B shows the relationship between difference $\gamma$ between diameter c of the trench 4 at depth Y2 (0.2 µm, for example) lower than the middle 4b and diameter b of the trench 4 at the middle 4b, and the number of defects. When data shown in FIG. 19A was obtained, the difference γ between the diameters c and b was set at a constant value of 10 nm. The taper angle θ was changed in a range from 89.7° to 90.5°. When data shown in FIG. 19B was obtained, the taper angle θ was set at a constant value of 90°. The difference γ was changed in a range from 5 nm to 20 nm.

As obvious from FIG. 19A, the number of defects can be reduced when the taper angle θ is increased. Furthermore, as obvious from FIG. 19B, the number of defects can be reduced when the diameter difference γ is increased. Based on the experimental results, the inventors actually made a trench 4 under predetermined conditions to measure an operating characteristic of a device. The number of defects can be reduced to about 1/40 of the number of defects in the conventional configuration.

According to the above-described manufacturing method, the silicon substrate 1 is etched so that the trench 4 is formed into the bottle shape with the middle 4b. The first conductive film 7 is buried in the trench 4 so as have the depression 7b located lower below the middle 4b. The second conductive film 8 is formed in the depression 7b of the first conductive film 7. The second conductive film 8 formed in the trench 4 is etched so that the upper surface thereof is located below the middle 4b. The upper surface 8a of the second conductive film 8 is planarized. The insulating film 29 is formed over the second conductive film 8 in the trench 4. The insulating film 29 is then removed so that the upper surface 8a of the second conductive film 8 is exposed. Accordingly, the insulating film 29 formed over the second conductive film 8 can easily be removed. Subsequently, even when the third conductive film 10 is formed on the second conductive film 8, reliable electrical connection can be achieved between the first and second conductive films 7 and 8, and the third conductive film 10. Consequently, the resistance values of the conductive films can be reduced. Moreover, the experimental results show that the process margin and yield can be improved, whereupon the number of defects can be reduced.

Figure 20A:
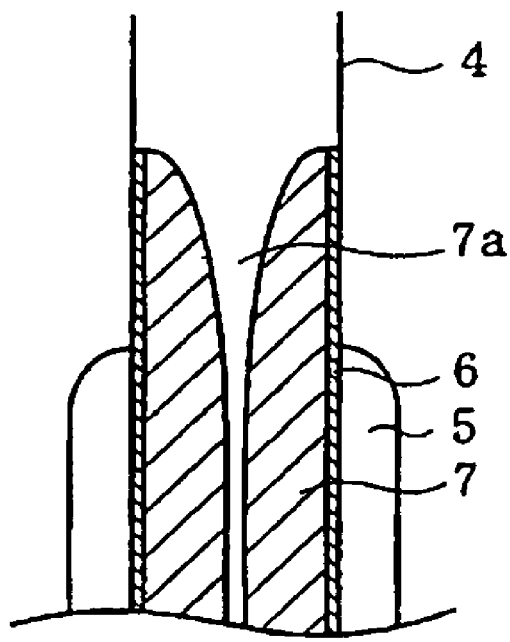
FIG. 20A is a view similar to FIG. 7, showing a modified form of the embodiment.
Figure 20B:
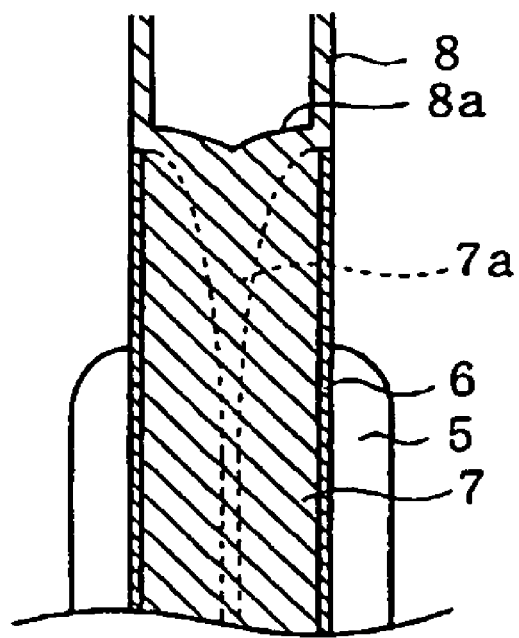
FIG. 20B is a view similar to FIG. 8, showing the modified form.

Several modified forms of the foregoing embodiment will now be described. FIGS. 20A and 20B shows a modified form of the embodiment and differs from the embodiment in that the second conductive film 8 is also buried in the seam 7a.

The first conductive film 7 is formed in the trench 4 and an upper of the film 7 is etched, as shown in FIG. 20A. When a taper angle at the bottom 4a side (an angle between the sidewall of the trench 4 and the upper surface of the silicon substrate 1) is increased, a ratio of a diameter at the surface side of the substrate to a diameter at the bottom 4a side of the trench 4 is reduced such that the seam 7a is likely to be produced when the first conductive film 7 is formed in the trench 4. In the case where the seam 7a is large, the seam 7a opens at its upper part when etched back. Thereafter, when the second conductive film 8 is formed over the first conductive film 7, the second conductive film 8 is also buried in the seam 7a. The upper surface 8a of the second conductive film 8 is subsequently etched so as to be planarized. Thus, this modified form can achieve the same effect as the foregoing embodiment.

Even when a non-doped material such as amorphous silicon is used for the first to fourth conductive films 7, 8, 10 and 12, a thermal treatment is applied to the conductive films at 800° C. or above in an assembly process. In this case, impurity is diffused into the conductive films 7, 8, 10 and 12 such that amorphous silicon is rendered electrically conductive. Consequently, no problem arises even when a non-doped material such as amorphous silicon is used.

The invention is applied to the DRAM 2 in the foregoing embodiment. However, the invention may be applied to a general purpose DRAM or a DRAM for specific application, a hybrid DRAM, other semiconductor memory device or semiconductor device.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A semiconductor device comprising:
   a semiconductor substrate formed with a trench having a sidewall including a middle point, the trench including a first part extending from a surface of the semiconductor substrate to the middle point of the trench and having a diameter that is gradually reduced as the first part extends deeper from the surface of the semiconductor substrate to the middle point of the trench, the trench including a second part that is deeper than the middle point of the sidewall and that has a larger diameter than the middle point of the sidewall;
   an electrically conductive film formed in an interior of the trench so as to be located lower than the middle point of the sidewall, the conductive film having a planarized upper surface; and
   a collar insulating film formed over the conductive film and the sidewall of the trench so as to extend through the middle point of the sidewall along the sidewall,
   wherein the electrically conductive film with a void includes a first conductive film located below the middle point of the sidewall relative to an inside of the trench and including an upper part formed with a recess and a discrete second conductive film formed in the recess of the first conductive film.

2. The semiconductor device according to claim 1, wherein the trench is curved so that a part of the sidewall thereof beneath the middle point of the sidewall is upwardly convex.

3. The semiconductor device according to claim 2, wherein the trench has a part of the sidewall thereof beneath the middle point of the sidewall, said part being formed into a reverse taper shape.

4. The semiconductor device according to claim 1, wherein the trench has a part of the sidewall thereof beneath the middle point of the sidewall, said part being formed into a reverse taper shape.

5. The semiconductor device according to claim 1, wherein the conductive film is made from a polycrystalline silicon.

* * * * *